United States Patent [19]
Garber et al.

[11] Patent Number: 5,952,765
[45] Date of Patent: Sep. 14, 1999

[54] REDUCED COUPLING SAW FILTER

[75] Inventors: Edward M. Garber, Los Angeles; Daniel K. Ko, Monterey Park, both of Calif.; David A. Slavin, Louisville, Colo.

[73] Assignee: TRW Inc., Redondo Beach, Calif.

[21] Appl. No.: 08/756,846

[22] Filed: Nov. 26, 1996

[51] Int. Cl.$^6$ ................................................. H01L 41/08
[52] U.S. Cl. ........................................ 310/313 B; 333/195
[58] Field of Search ........................... 310/313 B, 313 C, 310/313 R; 333/193, 195

[56] References Cited

U.S. PATENT DOCUMENTS

| | | | |
|---|---|---|---|
| 3,803,520 | 4/1974 | Bristol et al. | 310/313 B X |
| 3,936,774 | 2/1976 | Mellon et al. | 310/313 B X |
| 3,987,376 | 10/1976 | Kerbel | 310/313 B X |
| 4,254,387 | 3/1981 | Redwood et al. | 310/313 B X |
| 5,021,699 | 6/1991 | Dufilie | 310/313 B |
| 5,028,831 | 7/1991 | Malocha et al. | 310/313 B X |
| 5,264,751 | 11/1993 | Dufilie et al. | 310/313 B |
| 5,313,177 | 5/1994 | Hickernell et al. | 333/193 |
| 5,438,306 | 8/1995 | Yamanouchi et al. | 333/195 |
| 5,663,695 | 9/1997 | Tanaka et al. | 333/193 |

OTHER PUBLICATIONS

Clinton S. Hartmann, "Weighting Interdigital Surface Wave Transducers by Selective Withdrawal of Electrodes," *1973 Ultrasonics Symposium Proceedings*, IEEE Cat. #73 CHO 807–8SU.

*Primary Examiner*—Mark O. Budd
*Attorney, Agent, or Firm*—Michael S. Yatsko

[57] ABSTRACT

A relatively narrow fractional bandwidth saw filter formed on a standard ST cut of quartz. The electrode pattern is modified in order to eliminate distortion. In particular, the overlap pattern is formed with one or less active overlaps per wavelength in those regions of the SAW filter where the weighing function is maximum. A plurality of six finger/$\lambda$ electrode patterns with two active overlaps per wavelength is also provided.

4 Claims, 14 Drawing Sheets

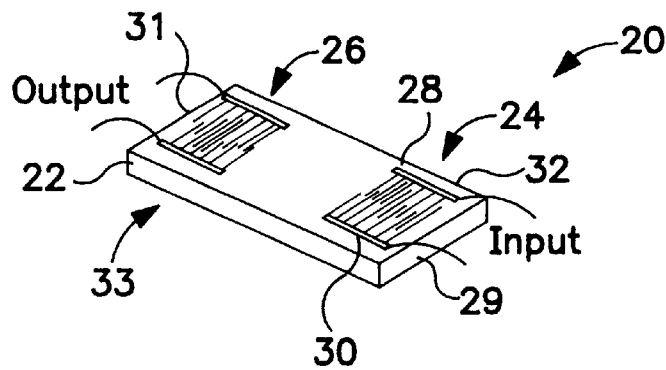
FIG. IA
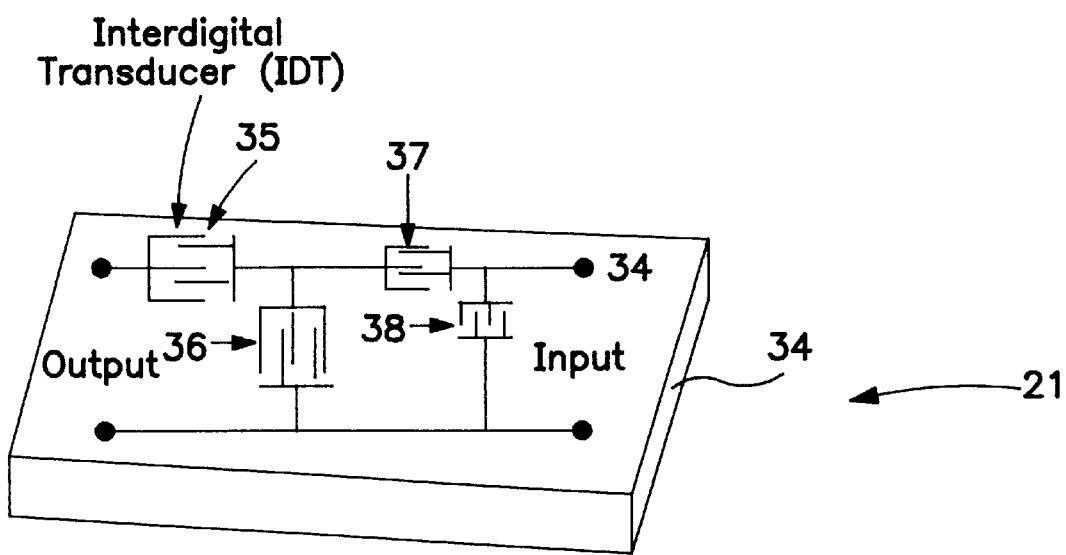
FIG. IB

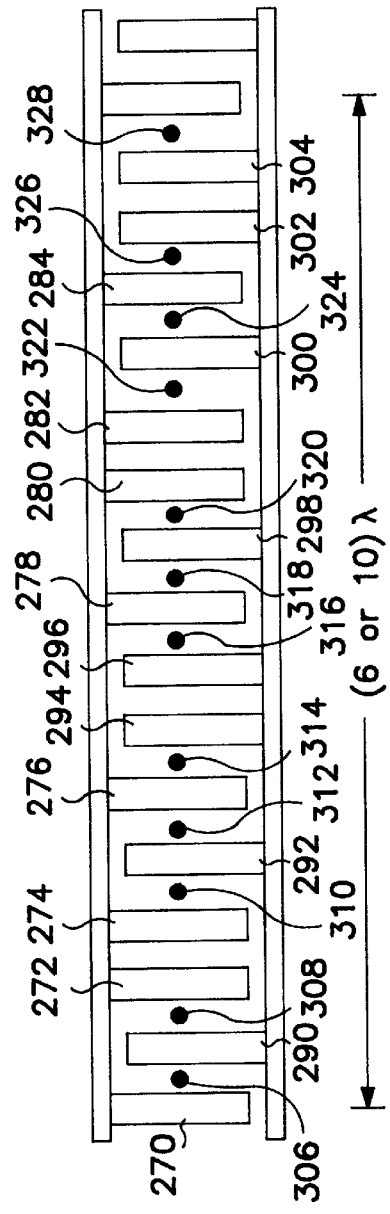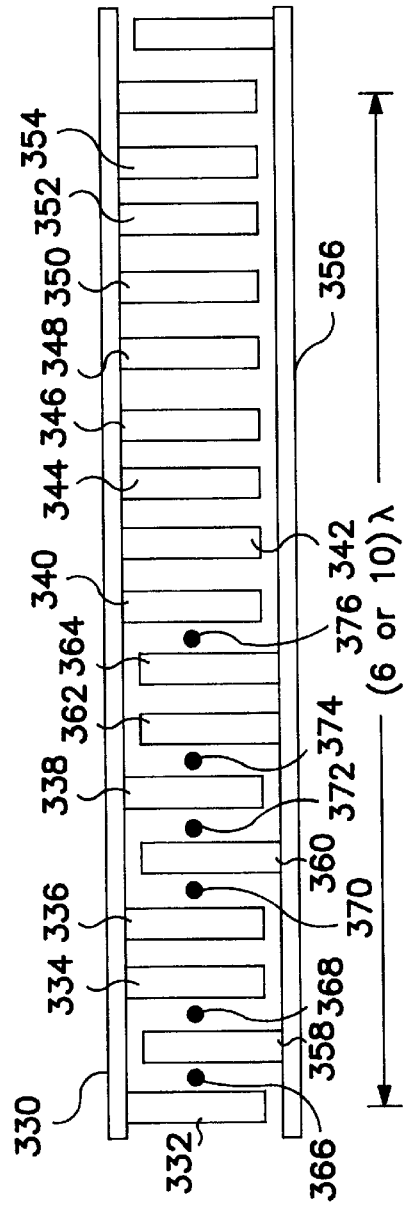

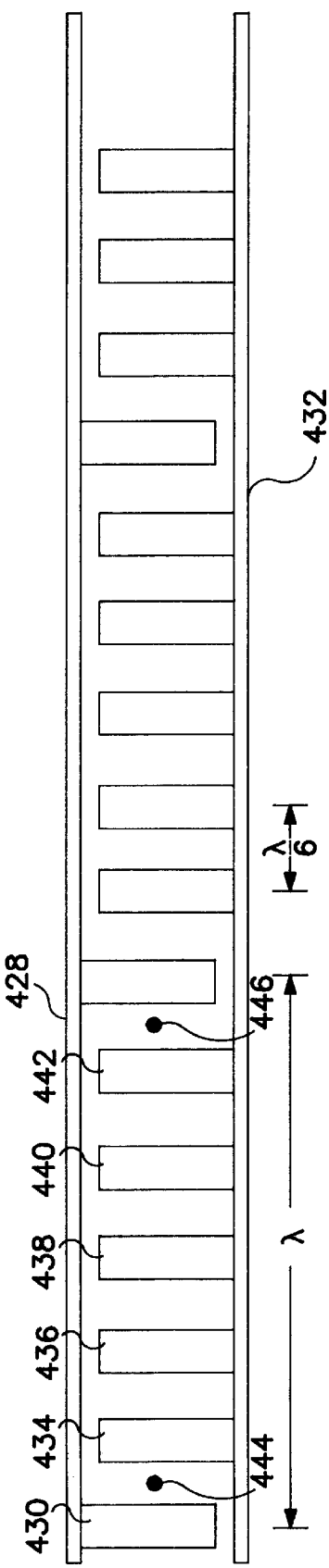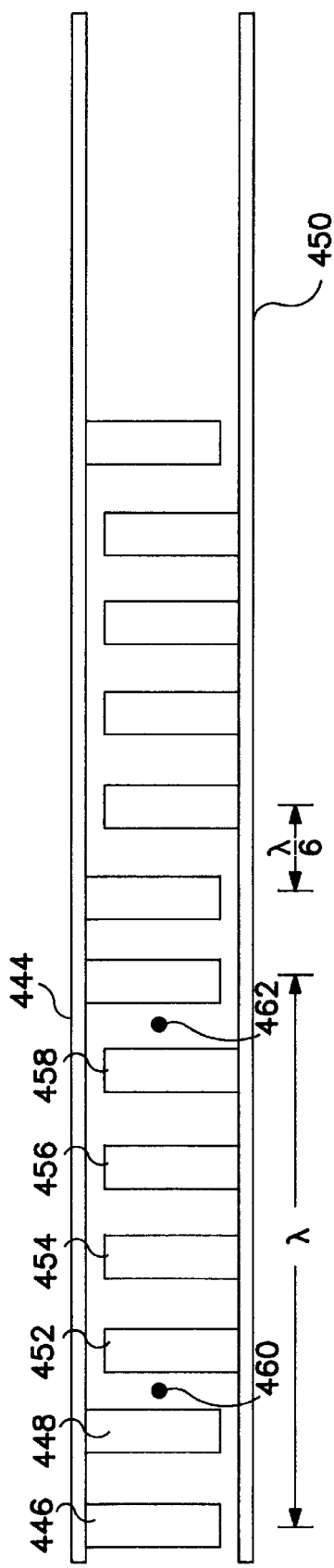

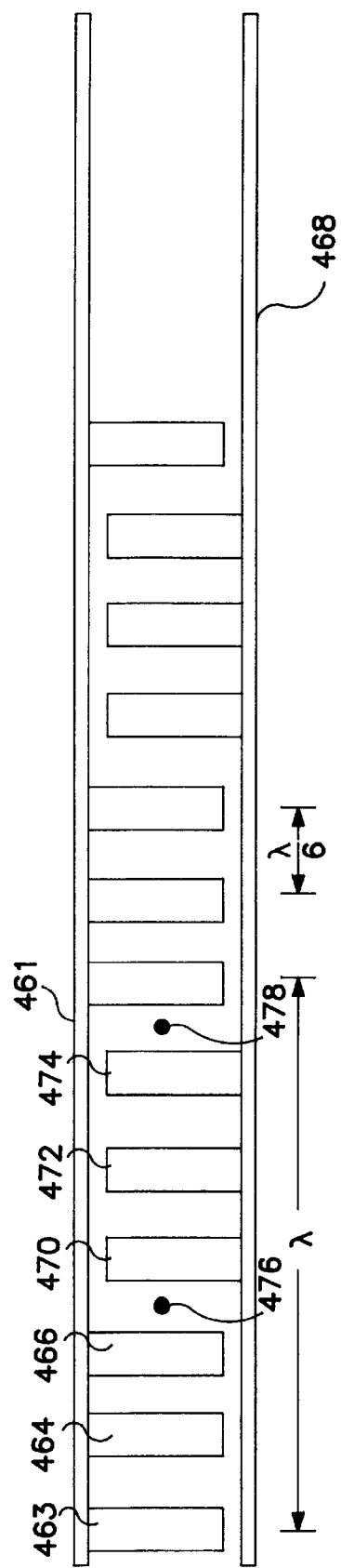

REDUCED COUPLING SAW FILTER

The invention described herein was developed during a Contract or Subcontract with the U.S. Government.

BACKGROUND OF THE INVENTION

1. Field of the Invention

The present invention relates to a surface acoustical wave (SAW) filter and more particularly to a SAW filter with a modified transducer pattern having in general a maximum of one or less active overlaps per wavelength, which eliminates distortion in relatively narrow fractional bandwidth SAW filters, while enabling the filter to be formed on a standard ST cut of quartz. SAW transducers are also disclosed with six (6) or more fingers per wavelength configured with two (2) active overlaps per wavelength.

2. Description of the Prior Art

Surface acoustical wave (SAW) filters are known in the art. Such filters are useful in various communication systems, such as receivers, as well as radar systems because of their small size and operating frequency range, typically from about 10 MHz to about 10 GHz or better.

SAW filters are constructed from interdigital transducers, which are electroacoustical transducers formed on a piezoelectric material, such as quartz. A metal film is deposited on the piezoelectric material to form an electrode pattern at each end, defining an input electrode and an output electrode. Both the input and output electrode patterns are formed with overlapping finger patterns to create the desired frequency response characteristics. A time-varying voltage applied to the input electrode causes acoustical waves to travel across the surface of the piezoelectric material to the output electrode. The acoustical waves received at the output electrode cause a voltage to be generated at the output electrode by piezoelectric action. Alternatively, filters can be constructed by electrically coupling single transducer SAW impedance devices.

Various techniques are known for shaping the frequency response of such SAW filters. Such techniques involve manipulation of the electrode overlap pattern of at least one of the transducers used in the filter. Both withdrawal weighing and overlap weighing techniques are known. Such techniques are generally described in "WEIGHING INTERDIGITAL SURFACE WAVE TRANSDUCERS BY SELECTIVE WITHDRAWAL OF ELECTRODES" by Clinton S. Hartmann, *Ultrasonics Symposium Proceedings*, IEEE Cat. #73 CHO 807 8SU, pp. 423–426, 1973.

Overlap weighing relates to forming elongated electrodes of opposite polarities on opposing edges of a piezoelectric material. Conductive fingers, electrically connected to the opposing electrodes, are formed generally normal to the electrodes such that the overlap between opposite polarity fingers varies smoothly along the length of the transducer. The frequency response is shaped by varying the overlap pattern of the fingers between the electrodes.

In the withdrawal weighing technique, the weighing is accomplished by using overlaps that change abruptly from I to the full aperture of the transducer, i.e. only overlaps of zero and unity are used. Withdrawal weighing is normally used in applications, such as narrow bandwidth-bandpass filters and pulse compression filters.

Another important consideration of SAW filters is the coupling constant of the particular piezoelectric substrate material utilized. For optimum performance, the coupling constant of the substrate material must be appropriate for the fractional bandwidth of the device. For relatively large fractional bandwidth devices, relatively strong coupling constants are required to minimize insertion loss. Alternatively, for relatively narrow fractional bandwidth SAW filters, relatively weak coupling constants are used to minimize the distortion.

Various piezoelectric materials are known to be used as substrates in SAW filters, including lead zirconate-titanate (PZT), lithium niobate (LiNbO3), lithium tantalate (LiTaO3), bismuth germanium oxide (Bi12GeO20), quartz (SiO2), lithium tetraborate (Li2B4O7), zinc oxide and aluminum nitride. The coupling constants of such material vary. Typically, an ST cut of quartz is used for relatively narrow fractional bandwidth filters. However, for sharp cut-off filters with fractional bandwidths less than about 0.3%, significant distortion results if known electrode patterns are used.

SUMMARY OF THE INVENTION

It is an object of the present invention to provide a surface acoustical wave (SAW) filter that solves various problems of the prior art.

It is yet another object of the present invention to provide a SAW filter with a relatively narrow fractional bandwidth, formed on an ST cut of quartz, with minimal distortion.

Briefly, the present invention relates to a relatively narrow fractional bandwidth saw filter formed on a standard ST cut of quartz. The transducer pattern is modified in order to eliminate distortion. In particular, the transducer overlap pattern is formed with a maximum of one or less active overlaps per wavelength. A plurality of six and greater finger/transducer patterns with two active overlaps per wavelength is also provided.

BRIEF DESCRIPTION OF THE DRAWING

These and other objects of the present invention will be readily understood with reference to the following specification and attached drawing, wherein:

FIGS. 1A and 1B are perspective views of conventional SAW filter illustrating an input electrode and an output electrode; Note that SAW filters can also be constructed by electrically coupling single transducer SAW impedance devices (FIG. 1B).

FIG. 7A is a plan view of an electrode pattern for a known $3/8\lambda$, $5/8\lambda$ IDT or SPUDT;

FIG. 7B is a plan view for a reduced coupling electrode pattern for a $3/8\lambda$, $5/8\lambda$ IDT or SPUDT;

FIG. 8A is a plan view of a reduced coupling electrode pattern for an IDT having six fingers per wavelength in accordance with the present invention;

FIG. 8B is an alternate embodiment of FIG. 8A;

FIG. 8C is another alternate embodiment of FIG. 8A;

DETAILED DESCRIPTION OF THE INVENTION

Figure 2A:
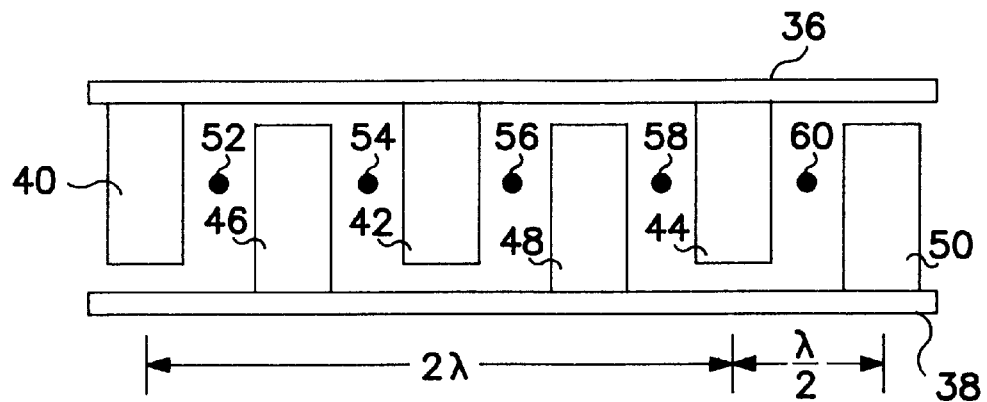
FIG. 2A is a plan view of a known electrode pattern for a SAW transducer illustrating two electrodes per wavelength.

A surface acoustical wave (SAW) filter is illustrated in FIGS. 1A and 1B and generally identified with the reference numerals 20 and 21. The SAW filter is formed on a substrate 22 or 34 of a piezoelectric material, such as quartz. Known photolithographic techniques are used to form electrode patterns, forming what are commonly known as interdigital transducers, generally identified with the reference numerals 24, 26, 35, 36, 37 and 38. The electrode patterns 24,35, 36, 37 and 38 include elongated electrodes 28 and 30, called bus bars, formed adjacent opposing edges 32 and 33 of the substrate 22. The electrode patterns 24, 26, 35, 36, 37 and 38 are generally formed with a plurality of finger portions 36, which extend generally perpendicular to the bus bars 28 and 30 to form an overlapping finger pattern as generally illustrated in FIG. 1A, adjacent opposing ends 29 and 31, respectively, of the substrate 22. In FIG. 1A, a time-varying input signal is applied to the bus bars 28 and 30 of the input electrode pattern 24. This time-varying input signal causes acoustical waves to be generated via the piezoelectric effect and travel along the surface of the substrate 22 toward the other end of the substrate 22 where the output electrode pattern 26 is located. The acoustical waves, in turn, generate an output signal at the output electrode pattern 26 by piezoelectric action. Alternatively, filters can be constructed by electrically coupling single transducer SAW impedance devices as depicted in FIG. 1B As mentioned above, various piezoelectric materials are suitable for such SAW filters. An important aspect of the present invention is that a standard ST cut of quartz may be used for the substrate material 22 for a relatively narrow fractional bandwidth filter. In order to minimize, if not eliminate, the distortion, the electrode pattern for at least one of the transducers used in the filter is configured to have a maximum of one or less active overlaps per wavelength (i.e. one or less active overlaps per wavelength in the regions of the transducer 24 where the weighing function is maximum). Overlaps relate to the regions between adjacent fingers in which the fingers are not attached to the same potential.

SAW transducers with various finger overlap patterns are known. In addition, SAW filters with various combinations of electrode known as interdigital transducers (IDT) patterns are also known. Such electrode patterns, known as interdigital transducers (IDT) as discussed above, may either be used for the input electrode pattern 24 or the output electrode pattern 26, or both. Alternatively, these SAW transducers can be used as impedance elements in electrical filters as in FIG. 1B. As such, the weighing function or uniformity of the overlap of the fingers may not be constant. As will be understood by those of ordinary skill in the art, the principles of the present invention are applicable to electrode patterns or regions of electrode patterns in which the weighing function is a maximum, which contains one or less active overlaps per wavelength.

FIGS. 2A, 3A, 4A, 5A and 6A relate to various known configurations of electrode patterns for SAW transducers. FIGS. 2B, 3B, 4B, 5B and 6B illustrate reduced coupling electrode patterns in accordance with the present invention, corresponding to each of the embodiments of the known configurations illustrated in FIGS. 2A, 3A, 4A, 5A and 6A, respectively. As mentioned above, the reduced coupling electrode patterns, in accordance with the present invention, may be used for either the input electrode pattern 24 or the output electrode pattern 26, or both. These reduced coupling transducers can also be used in the SAW impedance elements of the filter architecture depicted in FIG. 1B.

Referring to FIG. 2A, a known two finger/λ electrode pattern is shown forming an interdigital transducer (IDT) having uniform finger widths and uniform spacing between fingers. The length of the electrode pattern is provided in terms of wavelength (λ). As shown in FIG. 2A, there are four fingers/2λ, forming what is known as a two finger/λ configuration. The electrode pattern includes a pair of bus bars 36 and 38, adapted to be disposed adjacent opposing edges 32 and 33 (FIG. 1A) of the substrate 22, which, as mentioned above, is a standard ST cut of quartz. A plurality of fingers 40, 42 and 44 are formed connected to the bus bar 36, extending generally perpendicular therefrom toward the bus bar 38. Similarly, a plurality of fingers 46, 48 and 50 are formed, connected to the bus bar 38, extending generally perpendicular therefrom toward the bus bar 36. With such a configuration, the fingers 40, 42 and 44 will be connected to one potential, while the electrodes 46, 48 and 50 are connected to a different potential, forming four active overlap regions over a distance of two wavelengths.

In particular, the dots 52, 54, 56, 58 and 60 represent active overlap regions; regions between adjacent fingers not attached to the same potential. As shown, there are four overlaps per two λ or two active overlaps per λ.

Figure 2B:
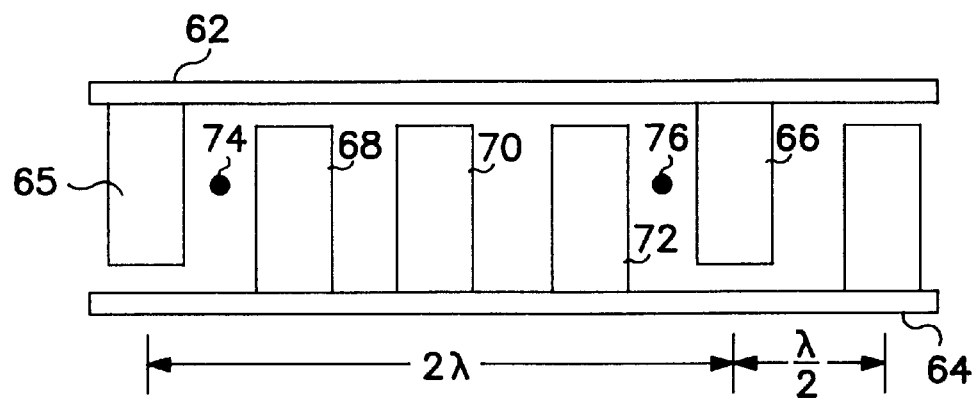
FIG. 2B is a plan view of a reduced coupling electrode pattern in accordance with the present invention for a configuration with two fingers per wavelength.

A reduced-coupling, two finger/λ IDT configuration, in accordance with the present invention, is illustrated in FIG. 2B. In this embodiment, two oppositely disposed bus bars 62 and 64 are provided. The bus bar 62 includes two extending fingers 65 and 66, while the bus bar 64 includes three extending fingers 68, 70 and 72 disposed between the fingers 65 and 66. In order to reduce distortion while utilizing a standard ST cut of quartz, the fingers 65, 66, 68, 70 and 72 are configured such that there are only two overlaps 74, 76 per two wavelengths or one active overlap per wavelength.

Figure 3A:
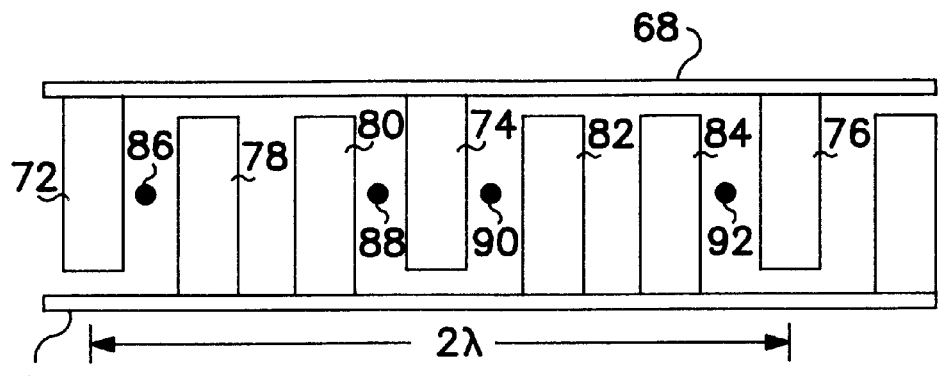
FIG. 3A is similar to FIG. 2A illustrating an electrode pattern configured for three fingers per wavelength.
Figure 3B:
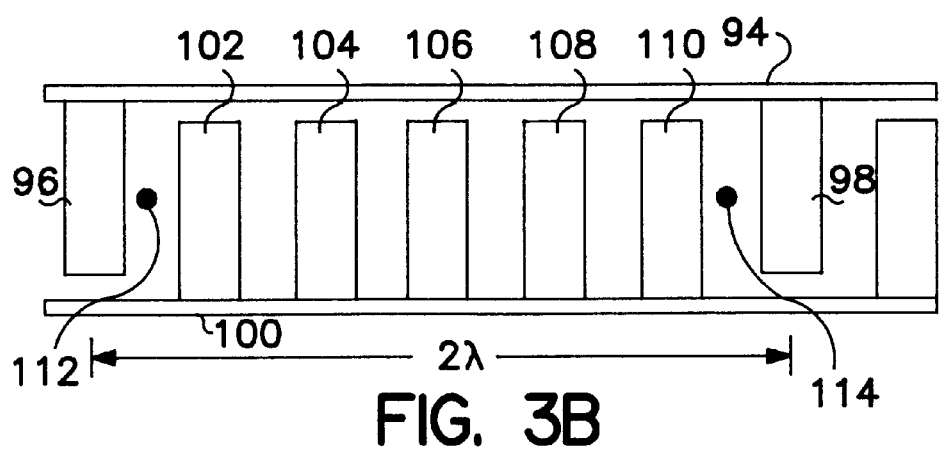
FIG. 3B is similar to FIG. 2B illustrating a reduced coupling electrode pattern for a SAW transducer with three fingers per wavelength.

FIG. 3A is a known three finger/λ wavelength electrode pattern for an IDT. In this configuration, two oppositely disposed bus bars 68 and 70 are provided. The bus bar 68 is formed with a plurality of extending fingers 72, 74 and 76, while the bus bar 70 is provided with a plurality of extending fingers 78, 80, 82 and 84. The extending fingers 78 and 80, connected to the bus bar 70, are disposed between the extending fingers 72 and 74, connected to the bus bar 68. Similarly, the fingers 82 and 84, connected to the bus bar 70, are disposed between the extending fingers 74, 76, connected to the bus bar 68. With such a configuration, there are six fingers 72, 78, 80, 74, 82 and 84 per two λ, and thus three fingers/λ. With the configuration as illustrated, there are four active overlap regions, represented by the dots 86, 88, 90 and 92, per two λ or two active overlaps per FIG. 3B is a three finger/λ reduced coupling IDT configuration in accordance with the present invention. In this embodiment, a first bus bar 94 is provided with two extending fingers 96 and 98. An oppositely disposed bus bar 100 is provided with five extending fingers 102, 104, 106, 108 and 110, disposed between the extending fingers 96 and 98. With such a configuration, only two active overlap regions 112 and 114 are formed for two λ, or one active overlap per λ, unlike the configuration illustrated in FIG. 2A, which utilizes two active overlaps per λ.

Figure 4A:
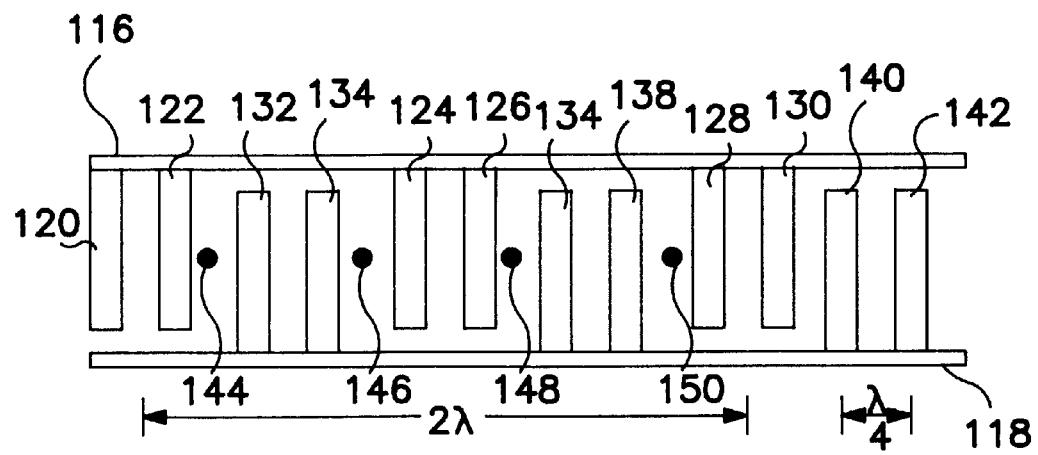
FIG. 4A is similar to FIG. 2A but for an electrode pattern configured with four fingers per wavelength.

FIG. 4A illustrates a four finger/λ IDT, formed with a pair of opposing bus bars 116 and 118. The bus bar 116 is formed with a plurality of fingers 120, 122, 124, 126, 128 and 130. The bus bar 118 is formed with a plurality of fingers 132, 134, 136, 138, 140 and 142. The fingers are configured such that two fingers of the same polarity (i.e. 120, 122) are disposed adjacent a pair of fingers (i.e. 132, 134) of opposite polarities. With such a configuration, four active overlaps 144, 146, 148 and 150 are formed in a length equivalent to two wavelengths (λ) or two active overlaps per λ.

Figure 4B:
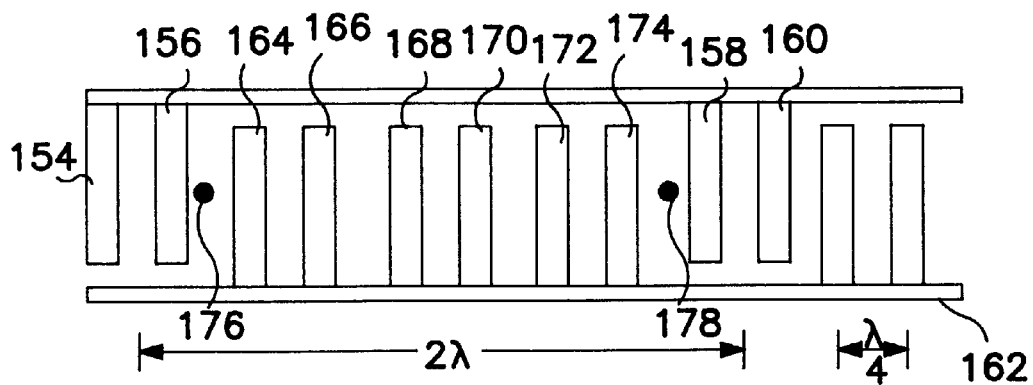
FIG. 4B is similar to FIG. 2B, illustrating a reduced coupling electrode pattern for a four finger per wavelength configuration.

FIG. 4B is a four finger/λ reduced coupling IDT electrode configuration in accordance with the present invention. In this embodiment, a bus bar 152 is formed with a plurality of extending fingers 154, 156, 158 and 160. The fingers 154 and 156, as well as the fingers 158 and 160 are disposed adjacent one another. An opposing bus bar 162 is formed with a plurality of extending fingers 164, 166, 168, 170, 172 and 174, disposed between the fingers 156 and 158 to define two active overlap regions 176 and 178. With such a configuration, there are eight fingers 156, 158, 164, 166, 168, 170, 172 and 174 per two wavelengths or four fingers per wavelength. The reduced coupling configuration, in accordance with the present invention, defines two active overlap regions 176 and 178 per two wavelengths or one active overlap region per wavelength.

Figure 5A:
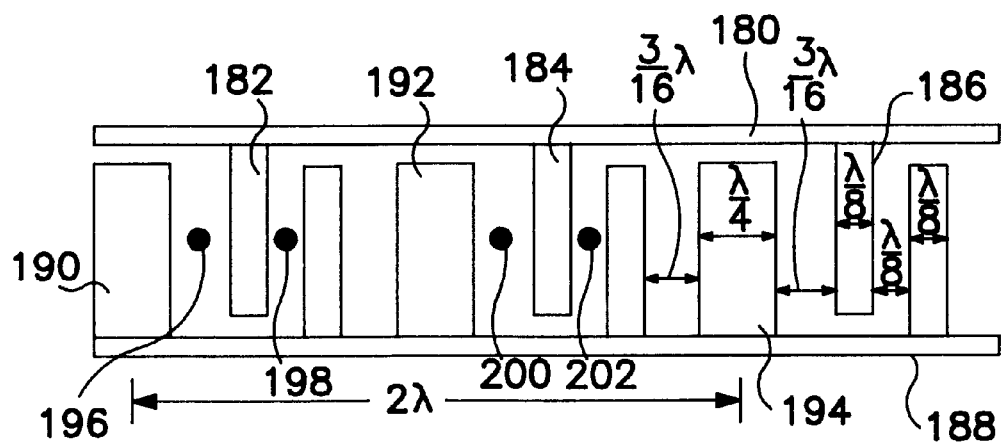
FIG. 5A is an electrode pattern for a known Electrode Width Controlled (EWC) Single Phased Unidirectional Transducer (SPUDT) electrode pattern.

The above-identified embodiments illustrate electrode patterns with uniform finger widths and uniform spacing between fingers within IDT's. The embodiments illustrated in FIGS. 5 and 6 relate to electrode patterns where neither the finger width nor spacing between adjacent fingers is uniform. For example, FIG. 5A illustrates an electrode pattern for a known Electrode Width Controlled (EWC), Single Phase Unidirectional Transducer (SPUDT). In this embodiment, one bus bar 180 is attached to relatively narrower fingers 182, 184 and 186, formed with the width of about λ/8. The other bus bar 188 is connected to a plurality of relatively wider fingers 190, 192 and 194 having a width of about λ/4. As shown in FIG. 5A, the spacing adjacent the wider fingers is about 3/16, while the spacing adjacent the narrow fingers is about λ/8. In such a configuration, four active overlap regions 196, 198, 200 and 202 are created per two wavelengths or two active overlaps per λ.

Figure 5B:
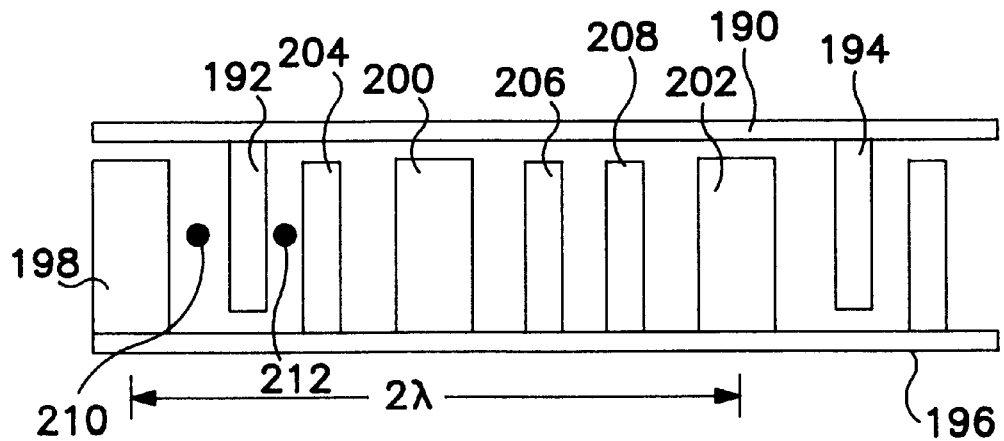
FIG. 5B is a plan view of a reduced coupling electrode pattern for an EWC SPUDT, in accordance with the present invention.

In accordance with the present invention, a reduced coupling EWC SPUDT is configured with one active overlap region per λ, as shown in FIG. 5B. In this embodiment, one bus bar 190 is formed with a plurality of fingers 192 and 194 of relatively narrow width. An opposing bus bar 196 is attached to a plurality of relatively wide fingers 198, 200, 202, as well as a plurality of relatively narrower width fingers 204, 206 and 208. The fingers 200, 202, 204, 206 and 208, connected to the bus bar 196, disposed between the fingers 192 and 194, defining two active overlap regions 210 and 212 per two wavelength or one active overlap region per wavelength.

Figure 6A:
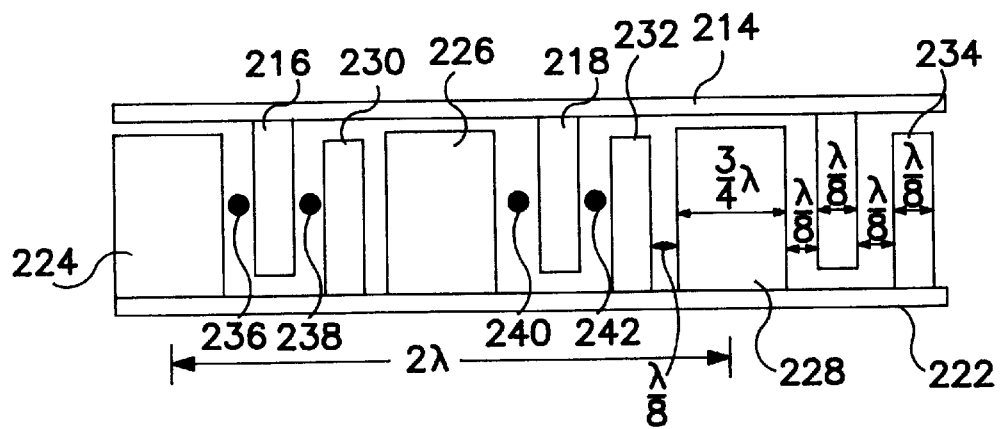
FIG. 6A is a plan view of an electrode pattern for a Distributed Array Reflector Transducer (DART) Single Phase Unidirectional Transducer (SPUDT)

FIG. 6A is a plan view of an electrode pattern for a known Distributed Array Reflector Transducer (DART) SPUDT. In this embodiment, one bus bar 214 is attached to a plurality of relatively narrow electrodes 216, 218 and 220 having a width equal to about λ/8. An opposing bus bar 222 is attached to a plurality of relatively wide fingers 224, 226 and 228 having a width of about 3/8λ and a plurality of relative narrow fingers 230, 232 and 234 having a width of about λ/8. The spacing between all the fingers is uniform and is about λ/8. With such a configuration, four active overlap regions 236, 238, 240 and 242 are created over a length of two λ or one active overlap region per λ.

Figure 6B:
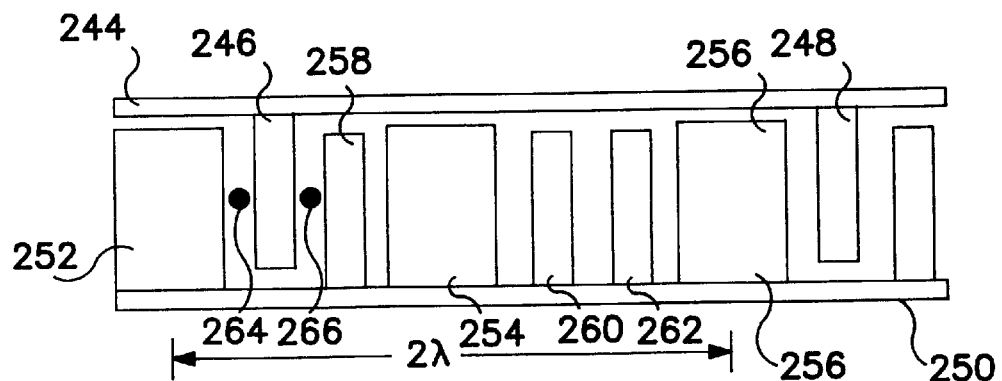
FIG. 6B is a plan view of a reduced coupling electrode pattern for DART SPUDT, in accordance with the present invention.

FIG. 6B is a DART SPUDT with a reduced coupling electrode pattern, in accordance with the present invention, utilizing one active overlap region per wavelength. In this embodiment, a bus bar 244 is formed with a plurality of relatively narrow finger portions 246 and 248. An opposing bus bar 250 is formed with a plurality of relatively wide fingers 252, 254 and 256, as well as a plurality of relatively narrow fingers 258, 260 and 262, all equally spaced relative to one another. With the configuration in accordance with the present invention, only two active overlap regions 264 and 266 are created per two wavelengths or one active overlap region per wavelength.

FIG. 7A is an embodiment of an electrode pattern for a SAW transducer having 16 uniform and equally spaced fingers per six wavelengths or 16 uniform equally spaced fingers per ten wavelengths, forming a 3/8 or 5/8 IDT or SPUDT. In this embodiment, one bus bar 268 is attached to a plurality of uniform width fingers 270, 272, 274, 276, 278, 280, 282 and 284 per either six or ten wavelengths. An opposing bus bar 288 is attached to a plurality of electrodes 290, 292, 294, 296, 298, 300, 302 and 304 for a repetition period of either 6 or 10 wavelengths, as shown in FIG. 7A. Such a configuration results in 12 active overlaps 306, 308, 310, 312, 314, 316, 318, 320, 322, 324, 326 and 328 every six or ten wavelengths or two active overlaps/λ for the six embodiment or 1.2 overlaps/λ for the ten λ embodiment.

Figure 7C:
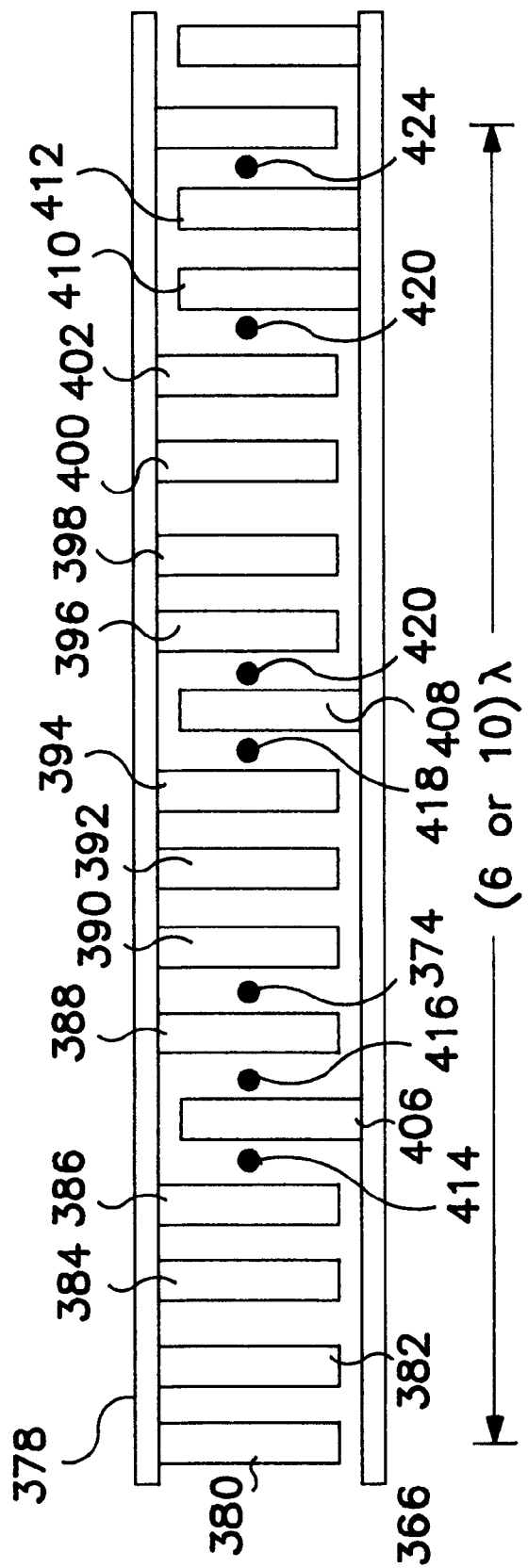
FIG. 7C is an alternate embodiment of a reduced coupling electrode pattern for a $3/8\lambda$, $5/8\lambda$ IDT or SPUDT, in accordance with the present invention.

FIGS. 7B and 7C illustrate reduced coupling 3/8λ, 5/8λ IDT or SPUDT in accordance with the present invention. In these two embodiments, the overlap pattern is modified to provide either one active overlap per λ for a six λ embodiment or 0.6 active overlaps per λ for a ten-wavelength long repeat distance structure. Referring first to FIG. 7B, one bus bar 330 is attached to a plurality of fingers 332, 334, 336, 338, 340, 342, 344, 346, 348, 350, 352 and 354. Using a "1" to designate a finger and a "0" to designate a space or finger attached to the other bus-bar 356, the configuration of the fingers formed by way of the electrode 330 is 1011010011111111. Similarly, a bus bar 356 is attached to a plurality of fingers 358, 360, 362 and 364 in a pattern to complement the pattern of the fingers connected to the bus bar 330. In particular, the configuration of the fingers connected to the bus bar 356 is 0100101100000000. Such a configuration defines six active overlap regions 366, 368, 370, 372, 374 and 376 per six or ten λ, effectively providing one active overlap/λ for the six λ embodiment, or 0.6 λ for the ten λ embodiment.

FIG. 7C is an alternate embodiment of a reduced coupling electrode pattern for a ⅜λ, ⅝λ IDT or SPUDT. In this embodiment, one bus bar 378 is attached to a plurality of fingers 380, 382, 384, 386, 388, 390, 392, 394, 396, 398, 400 and 402 configured as 1111011110111100. An opposing bus bar 404 is attached to a plurality of fingers 406, 408, 410 and 412 configured as 0000100001000011 to complement the configuration of the fingers attached to the bus bar 378. In this embodiment, six active overlaps 414, 416, 418, 420, 422 and 424 are formed per six or ten wavelengths or one active overlap per wavelength for the six λ embodiment or 0.6 active overlaps per wavelength for the ten λ embodiment.

FIGS. 8A, 8B and 8C relate to electrode patterns in accordance with the present invention, which may be configured with six or more fingers per wavelength. In these embodiments the distance between the centers of the fingers is about λ/6 for a 6 finger per wavelength transducer. Referring to FIG. 8A, one bus bar 428 is attached to one finger 430 per wavelength, thus forming a pattern 100000. An opposing bus bar 432 is formed with five fingers 434, 436, 438, 440 and 442 per wavelength configured as 011111. With such a configuration, two active overlap regions 444 and 446 are formed per wavelength.

In an alternate embodiment illustrated in FIG. 8B, one bus bar 444 is attached to two fingers 446 and 448 per wavelength, configured in a pattern 100001. An opposing electrode 450 is formed with four fingers 452, 454, 456 and 458 per wavelength, configured in a pattern 011110, defining two active overlap regions 460 and 462 per wavelength.

FIG. 8C illustrates yet another embodiment of a reduced coupling six finger per λ electrode configuration in accordance with the present invention. In this embodiment, a bus bar 461 is formed with three fingers 463, 464 and 466 per wavelength configured in a pattern 111000. An opposing bus bar 468 is likewise formed with three fingers 470, 472 and 474, configured in a pattern 000111 defining two active overlap regions 476 and 478 per wavelength.

Figure 9A:
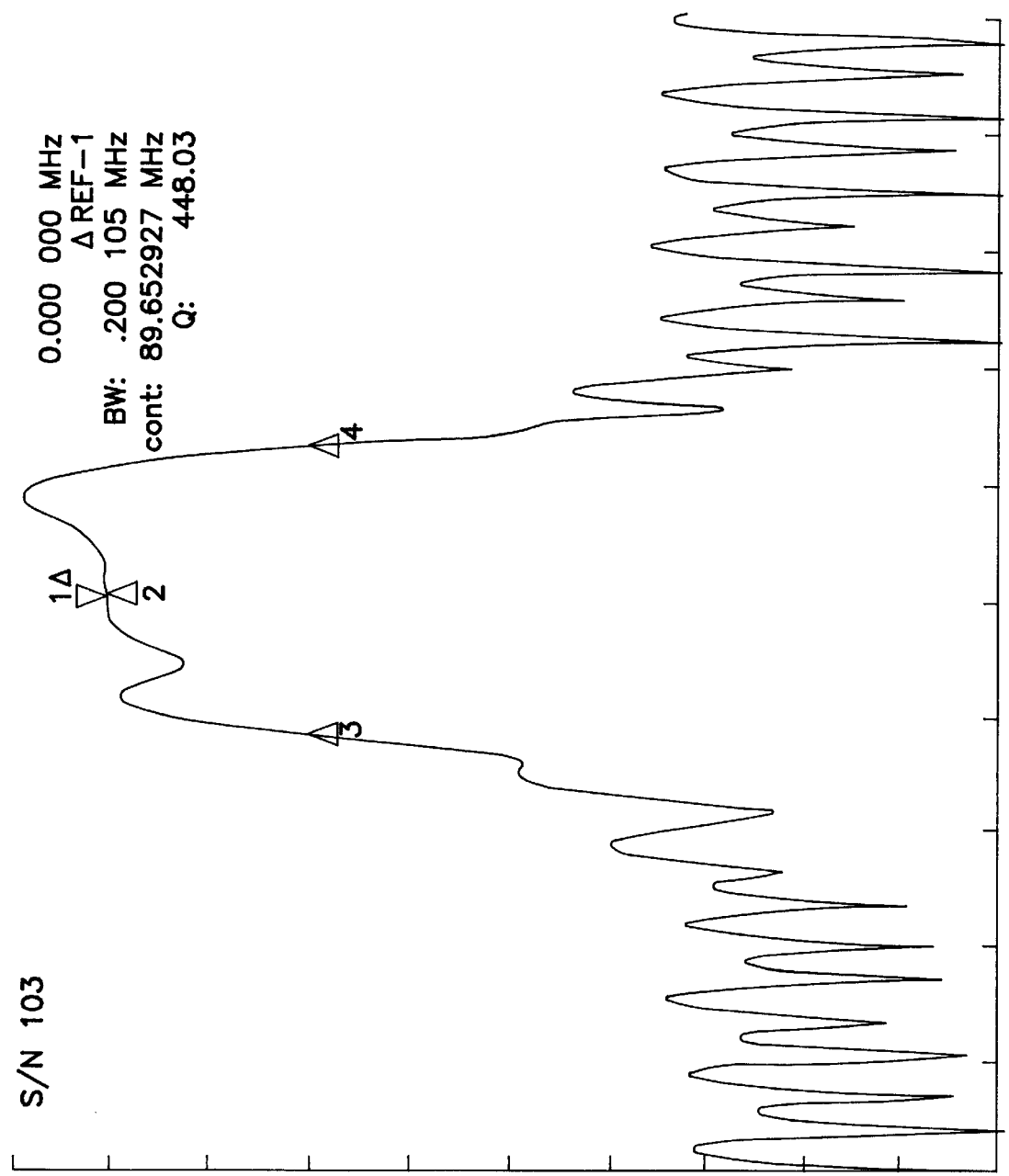
FIG. 9A is a graphical illustration of the magnitude response of the known filter of type depicted in FIG. 1A using a weighted IDT illustrated in FIG. 4A.
Figure 9B:
FIG. 9B is a graphical illustration of the group delay response of the known filter of type depicted in FIG. 1A using a weighted transducer illustrated in FIG. 4A.
Figure 10A:
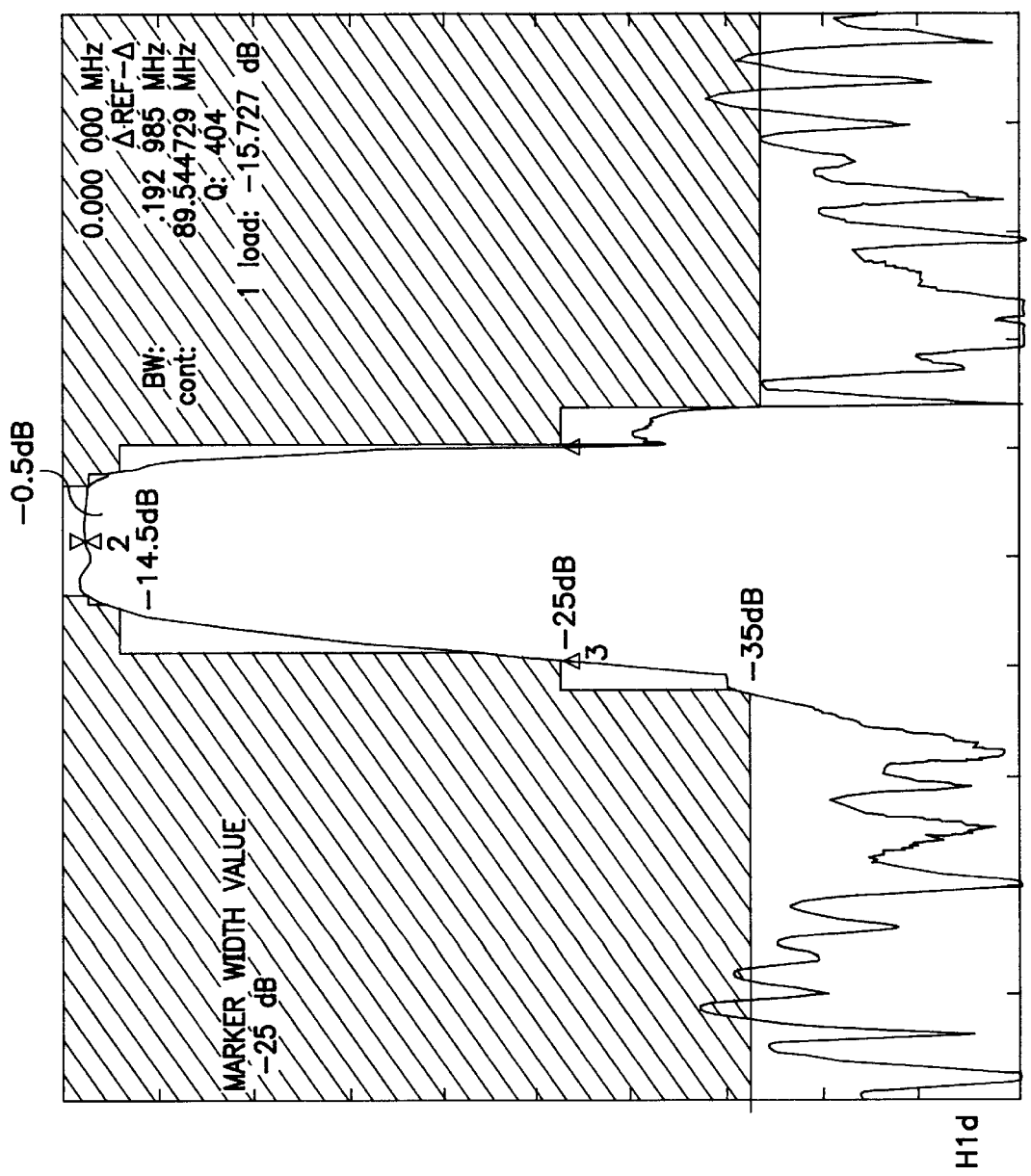
FIG. 10A is a graphical illustration of the magnitude response of a filter of type depicted in FIG. 1A using a reduced coupling electrode configuration illustrated in FIG. 4B.
Figure 10B:
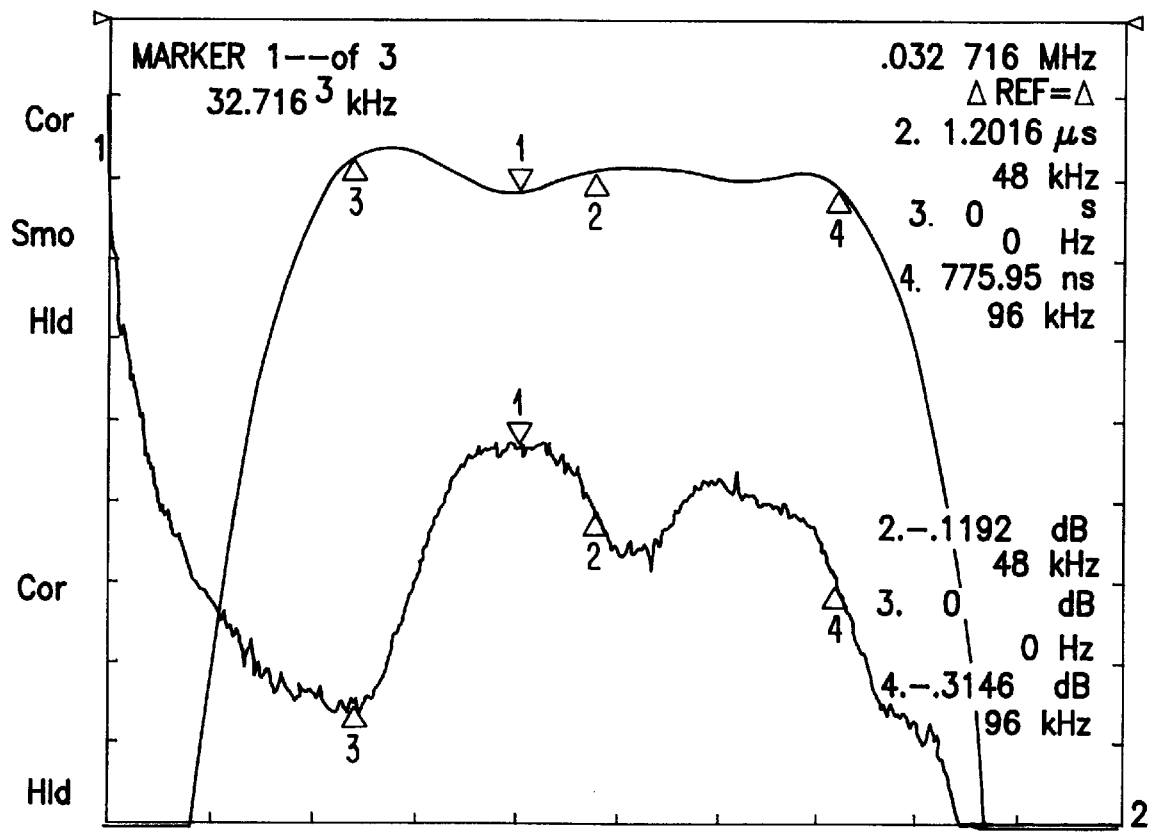
FIG. 10B is a graphical illustration of a filter of type depicted in FIG. 1A using a group delay response of the reduced coupling electrode pattern illustrated in FIG. 4B.

The improved response of the reduced coupling electrode pattern illustrated in FIG. 4B relative to the response of the known electrode pattern illustrated in FIG. 4A, is illustrated in FIGS. 9A, 9B, 10A and 10B. FIG. 9A represents the magnitude response of a SAW filter having the electrode pattern illustrated in FIG. 4A. FIG. 9B represents the group delay response of a SAW filter having an electrode pattern as illustrated in FIG. 4A. FIGS. 10A and 10B represent the magnitude and group delay response of a SAW filter having the reduced coupling electrode pattern illustrated in FIG. 4B. As shown in FIG. 9A, the passband has about a 9 dB peak-to-peak ripple and the rejection bulges out about 20 dB from the passband for the SAW filter with a known electrode pattern as illustrated in FIG. 4A. Referring to FIG. 9B, the peak-to-peak group delay ripple response across the passband is about 13.5 microseconds. As shown in FIG. 10A, the response of the SAW filter with the reduced coupling electrode pattern as illustrated in FIG. 4B illustrates that the passband is flat to about 0.5 dB, and that the rejection response is good to about 30 dB down from the passband. FIG. 10B illustrates that the group delay ripple is about 1.8 microseconds, or about 7.5 times better than the filter designed using the known approach.

Obviously, many modifications and variations of the present invention are possible in light of the above teachings. Thus, it is to be understood that, within the scope of the appended claims, the invention may be practiced otherwise than as specifically described above.

What is claimed and desired to be secured by Letters Patent of the United States is:

1. A surface acoustic wave (SAW) transducer comprising:
   a substrate formed from an ST cut of quartz having two opposing edges and opposing ends;
   at least one electrode pattern formed as a transducer disposed on said substrate, said one electrode pattern formed with an elongated bus bar adjacent each of said two opposing edges of said substrate defining a first electrode of one polarity and a second electrode of an opposite polarity, said first electrode formed with a first bus bar and one or more fingers electrically connected thereto extending toward said second bus bar generally perpendicular to said first bus bar, said second electrode formed with a second bus bar and one or more second fingers extending toward said first bus bar generally perpendicular to said second bus bar, said fingers connected to said first and second bus bars along the length of said first and second bus bars defining active overlap regions between adjacent fingers of opposite polarities, wherein, for at least a portion of the electrode patterns, said first electrode pattern and said second electrode pattern are formed with a total of 16 fingers per six or more wavelengths and configured to define one or fewer active overlap region per wavelength, wherein said fingers are formed with uniform width.

2. A surface acoustic wave (SAW) transducer comprising:
   a predetermined substrate having two opposing edges and opposing ends;
   at least one electrode pattern formed as a transducer disposed on said predetermined substrate, formed with an elongated bus bar adjacent each of said two opposing edges of said substrate defining a first electrode of one polarity and a second electrode of an opposite polarity, said first electrode formed with a first bus bar and one or more first fingers electrically connected thereto extending toward said second bus bar generally perpendicular to said first bus bar, said second electrode formed with a second bus bar and one or more second fingers extending toward said first bus bar generally perpendicular to said second bus bar, said fingers connected to said first and second bus bars along the length of said first and second bus bars defining active overlap regions between adjacent fingers of opposite polarities, wherein said first electrode and said second electrode pattern are formed with a total of 16 first fingers per 10 wavelengths and configured for at least a portion of the length of said electrode pattern to define 0.6 active or fewer overlap regions per wavelength, wherein said fingers are formed with uniform width.

3. A surface acoustic wave (SAW) transducer comprising:
   a predetermined substrate having two opposing edges and opposing ends;
   at least one electrode pattern formed as a transducer disposed on said predetermined substrate, formed with an elongated bus bar adjacent each of said two opposing edges of said substrate defining a first electrode of one polarity and a second electrode of an opposite polarity, said first electrode formed with a first bus bar and a plurality of first fingers per wavelength electrically connected thereto extending toward said second bus bar generally perpendicular to said first bus bar, said second electrode formed with a second bus bar and a plurality of second fingers per wavelength extending toward said first bus bar generally perpendicular to said second bus bar, said fingers connected to said first and second bus bars along the length of said first and second bus bars, wherein said first electrode is formed with two fingers per wavelength and said second electrode is formed with four fingers per wavelength.

4. A surface acoustic wave (SAW) transducer comprising:

a predetermined substrate having two opposing edges and opposing ends;

at least one electrode pattern formed as a transducer disposed on said predetermined substrate, formed with an elongated bus bar adjacent each of said two opposing edges of said substrate defining a first electrode of one polarity and a second electrode of an opposite polarity, said first electrode formed with a first bus bar and a plurality of first fingers per wavelength electrically connected thereto extending toward said second bus bar generally perpendicular to said first bus bar, said second electrode formed with a second bus bar and a plurality of second fingers per wavelength extending toward said first bus bar generally perpendicular to said second bus bar, said fingers connected to said first and second bus bars along the length of said first and second bus bars, wherein said first electrode is formed with three fingers per wavelength and said second electrode is formed with three fingers per wavelength.

* * * * *